(12) United States Patent
Wilson

(10) Patent No.: US 11,675,684 B2
(45) Date of Patent: *Jun. 13, 2023

(54) SYSTEM FOR MODELING INTELLIGENT SENSOR SELECTION AND PLACEMENT

(71) Applicant: United States of America—US Army, Alexandria, VA (US)

(72) Inventor: David Keith Wilson, Hanover, NH (US)

(73) Assignee: UNITED STATES OF AMERICA AS REPRESENTED BY THE SECRETARY OF THE ARMY, Alexandria, VA (US)

( * ) Notice: Subject to any disclaimer, the term of this patent is extended or adjusted under 35 U.S.C. 154(b) by 323 days.

This patent is subject to a terminal disclaimer.

(21) Appl. No.: 15/721,824

(22) Filed: Sep. 30, 2017

(65) Prior Publication Data

US 2018/0039556 A1 Feb. 8, 2018

Related U.S. Application Data

(63) Continuation-in-part of application No. 15/367,156, filed on Dec. 1, 2016, now abandoned.

(Continued)

(51) Int. Cl.
| | |
|---|---|
| G06F 13/00 | (2006.01) |
| G06F 11/34 | (2006.01) |
| G06F 17/18 | (2006.01) |
| G06F 11/00 | (2006.01) |
| G06F 30/367 | (2020.01) |

(Continued)

(52) U.S. Cl.
CPC ........ *G06F 11/3447* (2013.01); *G06F 11/002* (2013.01); *G06F 17/18* (2013.01); *G06F 30/367* (2020.01); *G01W 1/10* (2013.01); *G06F 30/20* (2020.01); *G06F 30/33* (2020.01)

(58) Field of Classification Search
CPC .... G06F 17/5009; G06F 13/00; G06F 11/002; G06F 11/3447; G06F 17/18; G06F 17/5022; G06F 17/5036; G06F 17/30595; G06F 16/245; G06F 16/29; G06F 16/355; G06F 30/20; G06F 17/50; G06F 30/367; G06F 30/33; G06N 5/04; G06N 7/005; G01W 1/10; H04L 41/18; G06K 9/6224; G06K 9/00; G06K 9/00664; G06K 9/0063; G06K 9/3216; G06K 9/6226; G06T 17/05;

(Continued)

(56) References Cited

U.S. PATENT DOCUMENTS

| | | | | |
|---|---|---|---|---|
| 5,247,843 A | * | 9/1993 | Bryan | ............... H01Q 3/02 |
| | | | | 73/865.6 |
| 5,719,774 A | * | 2/1998 | Rao | ..................... G06F 18/28 |
| | | | | 703/2 |

(Continued)

*Primary Examiner* — Amir Alavi
(74) *Attorney, Agent, or Firm* — Brian C. Jones

(57) ABSTRACT

The present system for modeling intelligent sensor selection and placement takes signal and sensor information and calculates a statistical inference. As signal data passes through a series of processors, it is transformed by functions to account for signal emission, sensor reception, environmental factors, and noise. This produces a simulation of what the emitted signal would appear to be at a given sensor. The system may be used to select the most effective sensors for a given area or to determine the best sensor coverage for a given area.

17 Claims, 2 Drawing Sheets

Related U.S. Application Data

(60) Provisional application No. 62/261,560, filed on Dec. 1, 2015.

(51) Int. Cl.
   *G01W 1/10* (2006.01)
   *G06F 30/20* (2020.01)
   *G06F 30/33* (2020.01)

(58) Field of Classification Search
   CPC ...... H04N 5/23219; H01Q 3/02; G06V 10/10; G06V 10/147
   USPC .................. 382/109, 255; 703/2, 6, 18, 22
   See application file for complete search history.

(56) References Cited

U.S. PATENT DOCUMENTS

| | | | | |
|---|---|---|---|---|
| 6,053,947 | A * | 4/2000 | Parson | G06F 30/33 703/14 |
| 6,399,939 | B1 * | 6/2002 | Sundaresan | G01N 29/36 73/768 |
| 6,545,601 | B1 * | 4/2003 | Monroe | B64D 45/0053 348/148 |
| 7,616,828 | B2 * | 11/2009 | Rahmes | G06K 9/0063 382/260 |
| 7,760,913 | B2 * | 7/2010 | Rahmes | G06T 17/05 382/100 |
| 8,050,568 | B2 * | 11/2011 | Hunt | H04B 10/1125 398/118 |
| 8,793,004 | B2 * | 7/2014 | Grichnik | G05B 23/0235 700/47 |
| 10,679,131 | B2 * | 6/2020 | Alexander | H04W 4/38 |
| 2007/0198239 | A1 * | 8/2007 | Yagi | G06F 30/20 703/16 |
| 2009/0238426 | A1 * | 9/2009 | Fear | G06K 9/3216 382/128 |
| 2010/0048242 | A1 * | 2/2010 | Rhoads | G06F 16/50 455/556.1 |
| 2011/0202326 | A1 * | 8/2011 | Salemann | G06F 16/29 703/6 |
| 2013/0054603 | A1 * | 2/2013 | Birdwell | G06K 9/6253 707/738 |
| 2014/0080428 | A1 * | 3/2014 | Rhoads | H04W 4/025 455/88 |
| 2014/0201126 | A1 * | 7/2014 | Zadeh | A61B 5/165 706/52 |
| 2017/0154140 | A1 * | 6/2017 | Wilson | G06F 30/20 |
| 2018/0039556 | A1 * | 2/2018 | Wilson | G06F 11/002 |
| 2019/0210746 | A1 * | 7/2019 | Feconda | G01S 5/10 |

\* cited by examiner

SYSTEM FOR MODELING INTELLIGENT SENSOR SELECTION AND PLACEMENT

CROSS-REFERENCE TO RELATED APPLICATIONS

This patent application claims the benefit of U.S. Provisional Application No. 62/261,560 filed Dec. 1, 2015 and U.S. Nonprovisional application Ser. No. 15/366,946 filed Dec. 1, 2016. The foregoing applications are incorporated by reference.

STATEMENT REGARDING FEDERALLY SPONSORED RESEARCH OR DEVELOPMENT

The invention described herein was made by an employee of the United States Government and may be manufactured and used by the Government of the United States of America for governmental purposes without the payment of any royalties thereon or therefore.

FIELD OF INVENTION

This invention relates to the field of computer modeling and more specifically to a system for intelligent sensor placement and sensor network optimization.

BACKGROUND OF THE INVENTION

The US Army Corps of Engineers relies extensively on the use of sensors to provide mission critical data in a range of environments. There are millions of commercially available sensors which perform a particular range of functions, and which may offer varying levels of performance depending upon the weather, terrain, and other conditions of the environment in which they are placed.

Wave propagation modeling is an essential component for data-gathering, tracking, and surveillance activities which require the intelligent placement of sensors. Intelligent placement of sensors is difficult, often requiring testing of numerous settings and configurations to ensure that an area is adequately covered. Both topography and weather affect the efficacy of the model. Physical barriers may divert signals. The transmission of light, sound, or radio waves on a clear, dry day may be different from a foggy night or a rainy, windy day.

Many companies such Atmospheric and Environmental Research (AER) Inc., NextGen Federal Systems, ProLogic Inc., Toyon Corporation, and Blue Ridge Research and Consulting LLC provide specialized sound, seismic, and image sensors designed to provide optimum sensing capability for particular purposes and environments. However, selection of these sensors may require time-consuming trial and error.

To design reliable sensor networks, the military and private sector require data as to the sensing capabilities and signal features of sensors. Engineers also require extensive environmental data to optimize placement of signal emitters and sensors, as these factors effect sensor performance.

There is an unmet need in the art for computer modeling systems which can intelligently select appropriate emitting and sensing devices and calculate the probability of signal detection for various placements and points in time.

There is a further unmet need for a computer modeling system that can simulate geographical and environmental conditions that impact transmission of light, sound, and other energy waves for military and civilian applications.

SUMMARY OF THE INVENTION

The present invention is a system for modeling performance of geographically distributed sensors. The system includes a user interface configured to receive user defined Signal_Feature Attributes and user defined Directional Attributes. The system includes an Instantiation Processor configured to instantiate Signal Objects. Each of the Signal Objects includes the Signal_Feature Attributes. The system includes a Radiated_Signal Processor configured to receive the Signal Object and user defined Directional Attributes and to perform a Radiated_Signal Function. This function calculates Directional_Dependence Attributes for each of the Signal_Feature Attributes and updates the Signal Object with the Directional_Dependence Attributes. The system includes a Signal_Propagation Processor configured to receive the Directional_Dependence Attributes and environmental data, and perform a Signal_Propagation Function. This function updates the Signal Object with Vector_Signal Attributes for each of the Signal_Feature Attributes. The system includes a Noise/Gain_Transfer Processor configured to receive the Vector_Signal Attributes and Sensor_Device Attributes and perform a Noise/Gain_Transfer Function. This function updates the Signal Object with Scalar_Signal Attributes. The system includes an Inference Processor configured to receive the Scalar_Signal Attributes and the Sensor_Device Attributes and perform an Inference Function. This function creates a statistical model of signal propagation from which an inference can be drawn.

BRIEF DESCRIPTION OF SEVERAL VIEWS OF THE DRAWING(S)

TERMS OF ART

As used herein, the term "Directional Attributes" refers to any physical attribute affecting the direction of a signal.

As used herein, the term "Directional_Dependence Attributes" refers to any attribute of a which is a function of a directional attribute.

As used herein, the term "environmental data" refers to weather, topography, permanent or temporary structures, field or physical phenomena affecting the direction or magnitude of a signal.

As used herein, the term "packet" refers to a data structure in which data is aggregated and transmitted between functions, objects or interfaces.

As used herein, the term "instantiate" refers to creating an object with one or more used-defined attributes.

As used herein, the term "object" refers to a data structure containing values and attributes which invoke functions when populated or updated; an object is a type of virtual processing component.

As used herein, the term "processor" refers any hardware, software or electrical component which performs mathematical or statistical computations.

As used herein, the term "user defined" refers to refers to attributes or values that are updated or changed by a user, external data base, sensor input or other source.

As used herein, the term "interface" refers to a component for receiving, transmitting or displaying data.

As used herein, the term "virtual processing component" means a special purpose computing component configured with functions and static variables to receive and process input, perform special purpose processing functions, and produce an output based on binding to a microprocessor at run-time.

DETAILED DESCRIPTION OF THE INVENTION

Figure 1:
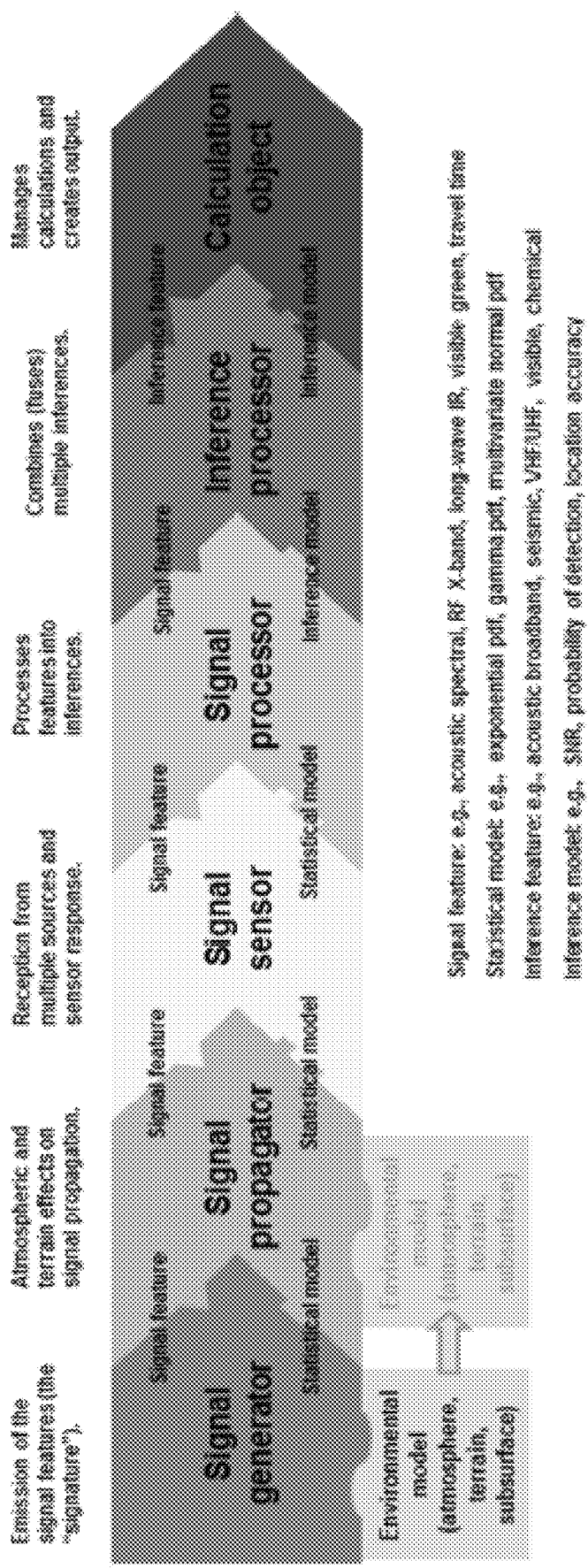
FIG. 1 illustrates an exemplary method 100 implemented on an exemplary system for modeling an optimized sensor network.

FIG. 1 illustrates exemplary method 100 implemented on exemplary system 200 for modeling an optimized sensor network.

Each function identified in FIG. 1 may be viewed as a processor or processing module in which information is systematically represented by a Signal Object, and pursuant to which information flowing between each module is efficiently and reliably controlled through the generic attribute specification of the Object specifications. In various embodiments, the invention may be implemented in Java or any other programming language. The use of a novel Signal Object, with attributes and unique functions, ensures the reliability of the model. For example, the inputs and outputs at each stage in the modeling process are compatible, e.g., only acoustic signal features can be sent to an acoustic sensor representation.

In Step 1, a user instantiates a Signal Object by assigning values to Signal_Feature Attributes through a user interface. Signal_Feature Attributes represent characteristics and data types associated with a signal. For example, signals may be electrical, analog, audio, visual, discrete, periodic, wave form and/or may have a range of audio, visual and temporal parameters known in the art.

The Signal_Feature Attributes are updated by a series of functions which revise the attributes of the instantiated Signal Object to create various statistical models which ultimately allow inferences to be drawn as to signal propagation probability or detection of an emitter with known location coordinates by a sensor with known location coordinates. In various embodiments, the user-defined Signal_Feature Attributes represent the identifying qualities of the signal that are used for sensing and processing. The use of a novel Signal Object with attributes and unique functions ensures the reliability of the model. For example, the inputs and outputs at each stage in the modeling process are compatible, e.g., only acoustic signal features can be sent to an acoustic sensor representation. For example, for visible processing, features may represent red, yellow, or green bands; for acoustic processing, they may be octave bands on a user interface. Each user-defined Signal_Feature Attribute is associated with a statistical model describing the random variations or uncertainties in the signal, such as an exponential or Gaussian distribution. Inferences, such as signal-to-noise ratio, probabilities of detection, target bearing, and location accuracy, are calculated from the signal statistical models in later steps.

In Step 2, a Radiated_Signal Function is invoked by the Signal Object once the attributes required for inputs to the function are updated. The Radiated_Signal Function requires that the user populate the Signal_Feature Attributes, as well as location coordinates. The Radiated_Signal Function produces output that is a statistical model for each feature which conveys the dependence of the signal on the direction of emission (azimuth and elevation angle) relative to the source. The statistical model and directional dependence are grouped together as Directional_Dependence Attributes for each signal feature. The Directional_Dependence Attributes for all of the features can be grouped into a Directional_Dependence Packet.

In Step 3, the Directional_Dependence Attributes for Signal Object are entered or updated, and a Signal_Propagation Function is invoked. This function receives as input the Directional_Dependence Packet containing the Directional_Dependence Attributes for each signal feature, produced in Step 2, the locations of the emitter and the sensor, and environmental data. The environmental data is statistical information as to geographical (e.g., topology), geological, and atmospheric environment (e.g., weather). The Signal_Propagation Function produces as output a statistical model direction of energy propagation of each signal received by the sensor and its magnitude, resulting in a Vector_Signal Attribute for each feature. The Vector_Signal Attributes for each feature are grouped into a Vector_Signal Packet.

In Step 4, a Noise/Gain_Transfer Function is invoked. The Vector_Signal Packets are partitioned into signals of interest and background noise. A transfer function (gain) is applied to each signal feature, and sensor self-noise is added for each feature. The total power associated with the signals of interest, and the background noise, are then separately calculated and represented as Scalar_Signal Attributes. The Scalar_Signal Attributes for all features are grouped into a Scalar_Signal Packet.

In Step 5, an Inference Function is invoked to calculate a statistical model of signal propagation from which an inference can be drawn, such as the mean signal-to-noise ratio, probability of detection, or target bearing. The inferences for each feature are grouped into an Inference Packet.

In Step 6, the inferences may be displayed on the user interface.

In an optional Step 7 of one embodiment, a fusion processing module receives as input the Inference Packets produced by an inference processing module, or by fusion processing modules. There are two types of fusion processing modules: feature fusion processors, which fuse all of the features in a packet into a single inference, and packet fusion processors, which receive multiple packets and fuse them (feature-by-feature) into a single inference packet. These two types of fusion processors implement the fuseFeatures and fusePackets methods, respectively, which provides a type-safe specification of the input and output inferences.

Certain embodiments may also include Sensor Databases containing Sensor_Device Attributes, Signal_Feature Databases containing Signal_Feature Attributes, and/or Relational Databases containing emitter and signal data, as well as Signal_Feature Attributes.

Figure 2:
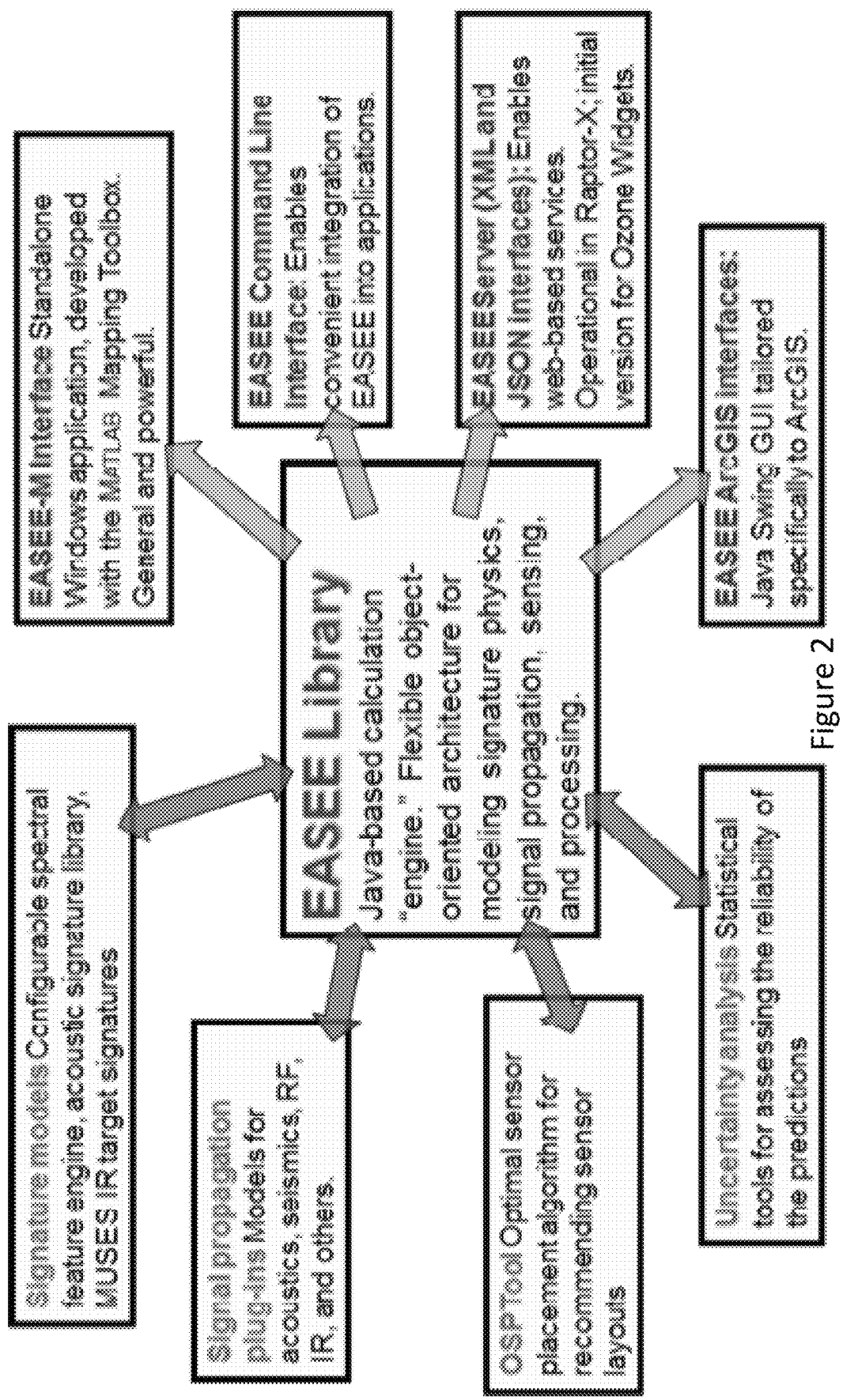
FIG. 2 illustrates EAASE system 200 as a series of independently functioning objects and virtual processing components.

FIG. 2 illustrates EAASE system 200 as a series of independently functioning objects and virtual processing components.

In the exemplary embodiment shown, a user interface 10 is configured to receive user defined Signal_Feature Attributes. Instantiation Processor 20 instantiates Signal Object 30 which is an object that includes said user defined Signal_Feature Attributes. User interface 10 is also configured to receive user selected Directional Attributes.

Radiated_Signal Processor 40 is configured to receive Signal Object 30 and user defined Directional Attributes from user interface 10. Radiated_Signal Processor 40 performs a Radiated_Signal Function to calculate Directional_Dependence Attributes for each signal feature and update Signal Object with these Directional_Dependence Attributes. Thus updated, Signal Object 30 represents a statistical model of the directional dependence of each signal feature.

Signal_Propagation Processor 50 receives Directional_Dependence Attributes and environmental data, and performs a Signal_Propagation Function to update Signal Object 30 with Vector_Signal Attributes for each signal feature. In the exemplary embodiment shown, Signal_Propagation Processor 50 utilizes external statistical data and models to incorporate geographical, terrain, geological, weather and other available environmental data. As updated, Signal Object 30 represents a statistical model of the direction and magnitude of each signal feature.

Noise/Gain Transfer Processor 60 which receives the Vector_Signal Attributes and Sensor_Device Attributes and performs Noise/Gain_Transfer Function to update Signal Object 30 with Scalar_Signal Attributes.

Inference Processor 70 receives Scalar_Signal Attributes and performs an Inference Function to create a statistical model of signal propagation from which an inference can be drawn. In various embodiments, these inferences may relate to various aspects of performance such as signal-to-noise ratio, probabilities of detection, target bearing, and location accuracy.

It will be understood that many additional changes in the details, materials, procedures and arrangement of parts, which have been herein described and illustrated to explain the nature of the invention, may be made by those skilled in the art within the principle and scope of the invention as expressed in the appended claims. It should be further understood that the drawings are not necessarily to scale; instead, emphasis has been placed upon illustrating the principles of the invention.

What is claimed is:

1. A system for modeling performance of geographically distributed sensors having processing capability and virtual processing components comprised of: a user interface configured to receive user defined Signal_Feature Attributes and user defined Directional Attributes; an Instantiation Processor configured to instantiate Signal Objects, wherein each of said Signal Objects includes said Signal_Feature Attributes; a Radiated_Signal Processor configured to receive said Signal Object and user defined Directional Attributes and to perform a Radiated_Signal to Function to calculate Directional_Dependence Attributes for each of said Signal_Feature Attributes and update said Signal Object with said Directional_Dependence Attributes; a Signal_Propagation Processor configured to receive said Directional_Dependence Attributes and environmental data, and performs a Signal_Propagation Function to update said Signal Object with Vector_Signal Attributes for each of said Signal_Feature Attributes; a Noise/Gain_Transfer Processor configured to receive said Vector_Signal Attributes and Sensor_Device Attributes and performs a Noise/Gain_Transfer Function to update said Signal Object with Scalar_Signal Attributes; and an Inference Processor configured to receive said Scalar_Signal Attributes and said Sensor_Device Attributes and performs an Inference Function to create a statistical model of signal propagation from which an inference can be drawn, wherein said environmental data is a geographical statistical model with attributes and functions impact of terrain on signal propagation, and wherein attributes and functions of said geographical statistical model are updated in real time and correlated to Signal_Feature Attributes.

2. The system of claim 1, wherein said Radiated_Signal Processor is configured to calculate the dependence of the signal on a direction of emission to create said Directional_Dependence Attributes.

3. The system of claim 1, wherein said Directional Attributes include location of an emitter, signal azimuth, and elevation angle relative to said emitter.

4. The system of claim 1 wherein said Signal_Propagation Processor further creates one or more Vector_Signal Packets containing: (1) location data coordinates; and (ii) Vector_Signal Attributes, wherein each Vector_Signal Attribute represents a Signal_Feature Attribute associated with a location.

5. The system of claim 1 wherein said Noise/Gain_Transfer Processor further creates a plurality of Noise_Signal Packets containing (i) a signals of interest partition and a background noise partition, (ii) an offset value background noise, and (iii) power level value of each of said Signal_Feature Attributes expressed in scalar values.

6. The system of claim 5, wherein said Noise/Gain_Transfer Processor is configured to apply a transfer function (gain) to each Vector_Signal Attributes.

7. The system of claim 5, wherein said Noise/Gain_Transfer Processor is further configured to separately calculate a total power associated with said signal of interest partition.

8. The system of claim 5, wherein said Noise/Gain_Transfer Processor is further configured to separately calculate a total power associated with background noise.

9. The system of claim 1, wherein said environmental data is a weather statistical model to provide an impact of weather on signal propagation.

10. The system of claim 1, wherein said environmental data is a geological statistical model to provide an impact of geology on signal propagation.

11. The system of claim 1, wherein said Inference Processor is configured to calculate a statistical inference for at least one of a mean signal-to-noise ratio, a probability of detection, a target bearing, and location accuracy.

12. The system of claim 11, wherein said Inference Processor is further configured to statistically combine all statistical inferences in said at least one inference packet into a single inference.

13. The system of claim 12 wherein each requirement is dynamically updated.

14. The system of claim 1, wherein said Inference Processor component is further configured to create at least one Inference Packet containing a statistical inference for at least one of a mean signal-to-noise ratio, a probability of detection, a target bearing, and location accuracy.

15. The system of claim 1, further including a Sensor Database which is a virtual processing component which is associated with a plurality of Sensor Device Attributes which is correlated with a plurality of requirements having a ranked priority value.

16. The system of claim 1, further including a Signal_Feature Database correlated with a plurality of Signal_Feature Attributes and further correlated with a statistical reliability data which is dynamically updated to perform a user defined multi-criteria analysis to optimize one or more ranked requirements and one or more reliability ratings.

17. The system of claim 1, with further includes a Relational Database comprising a plurality of signal identities, associated with a plurality of signals, and a plurality of Signal_Feature Attributes.

\* \* \* \* \*